(12) United States Patent
Ehnis et al.

(10) Patent No.: US 6,642,737 B2
(45) Date of Patent: Nov. 4, 2003

(54) METHOD OF GENERATING TRANSISTOR AC SCATTERING PARAMETERS SIMULTANEOUSLY WITH DC CHARACTERISTICS USING A SINGLE CIRCUIT SIMULATION WITH A SELF-CORRECTION SCHEME FOR THE ARTIFICIAL DC VOLTAGE DROPPED ACROSS THE 50-OHM RESISTOR REPRESENTING TRANSMISSION LINE IMPEDANCE

(75) Inventors: Paul Ehnis, Plano, TX (US); Keith R. Green, Prosper, TX (US)

(73) Assignee: Texas Instruments Incorporated, Dallas, TX (US)

( * ) Notice: Subject to any disclaimer, the term of this patent is extended or adjusted under 35 U.S.C. 154(b) by 121 days.

(21) Appl. No.: 09/978,929

(22) Filed: Oct. 15, 2001

(65) Prior Publication Data

US 2003/0071645 A1 Apr. 17, 2003

(51) Int. Cl.[7] ............................ G01R 31/26; G06G 7/48; G06F 17/50

(52) U.S. Cl. ............................ 324/769; 703/4; 703/14

(58) Field of Search .................................. 324/765, 768, 324/769; 703/3, 4, 13, 14

(56) References Cited

U.S. PATENT DOCUMENTS 3,789,301 A * 1/1974 Malaviya ..................... 324/765

* cited by examiner

*Primary Examiner*—Evan Pert
*Assistant Examiner*—Russell M. Kobert
(74) *Attorney, Agent, or Firm*—Frederick J. Telecky, Jr.; W. James Brady, III

(57) ABSTRACT

A method of generating transistor scattering parameters employs a single circuit simulation with a self-correction scheme for the artificial DC voltage dropped across the 50-Ohm resistor representing transmission line impedance. A sub-circuit without 50-Ohm transmission line resistance is used to compute transistor bias current via a current-controlled voltage source to compensate for the DC voltage dropped across a 50-Ohm resistor contained in the network.

6 Claims, 1 Drawing Sheet

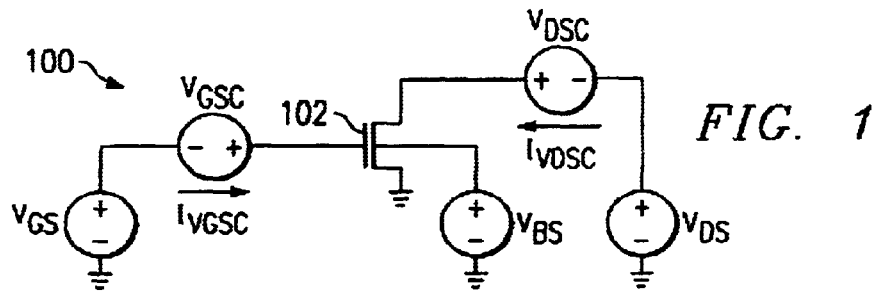
FIG. 1
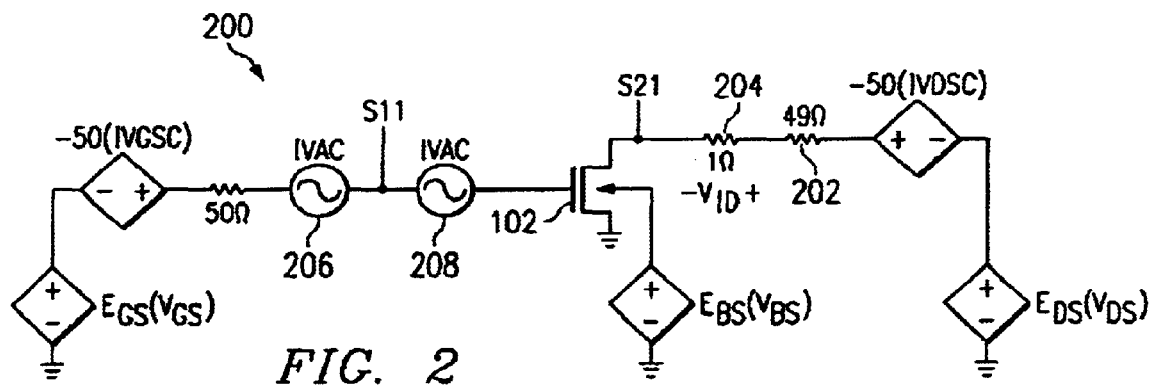
FIG. 2
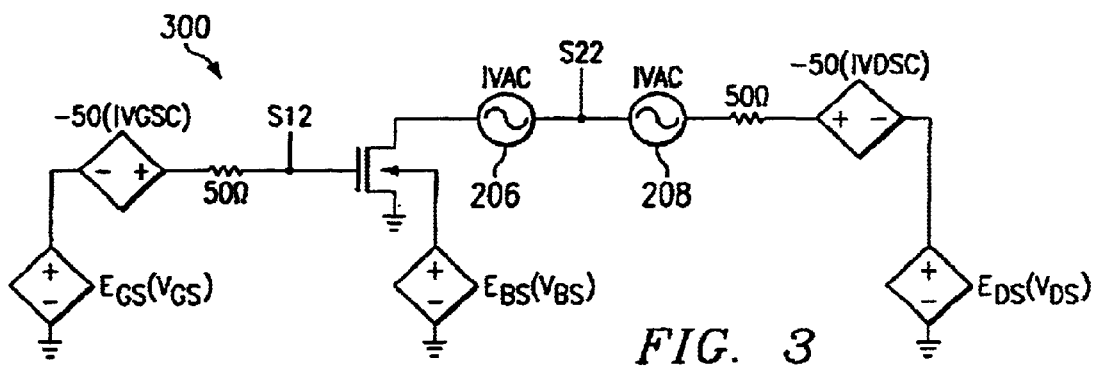
FIG. 3
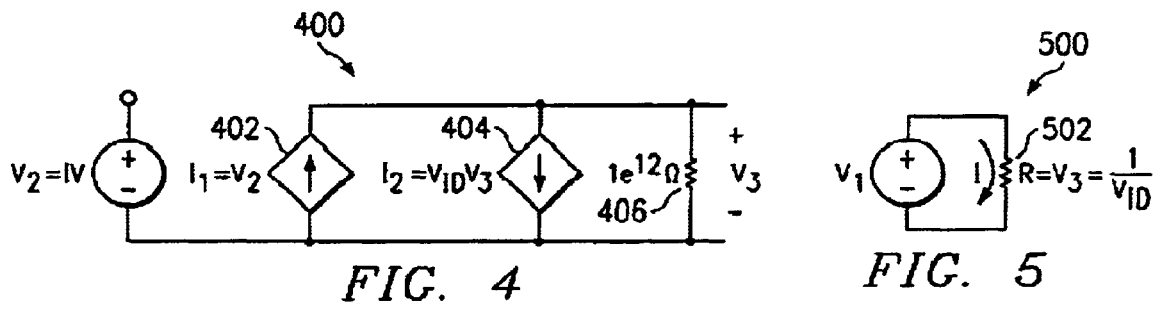
FIG. 4
FIG. 5

METHOD OF GENERATING TRANSISTOR AC SCATTERING PARAMETERS SIMULTANEOUSLY WITH DC CHARACTERISTICS USING A SINGLE CIRCUIT SIMULATION WITH A SELF-CORRECTION SCHEME FOR THE ARTIFICIAL DC VOLTAGE DROPPED ACROSS THE 50-OHM RESISTOR REPRESENTING TRANSMISSION LINE IMPEDANCE

BACKGROUND OF THE INVENTION

1. Field of the Invention

This invention relates generally to methods of measuring transistor scattering parameters, and more particularly, to a method of generating transistor scattering parameters using a single circuit simulation with a self-correction scheme for the artificial DC voltage dropped across the 50-Ohm resistor representing transmission line impedance.

2. Description of the Prior Art

The standard approach for generating transistor scattering parameters from a single circuit simulation produces erroneous results because of transistor debiasing caused by the unreal DC voltage dropped across the 50-Ohm resistance that is included to model transmission line impedance in the frequency domain. In view of the foregoing, it would be desirable and advantageous in the art to provide a correction for the problem of debiasing, that is typically, but erroneously ignored. It would further be advantageous to provide an approach to providing the transistor DC characteristics as part of the AC solution using solely one simulation.

SUMMARY OF THE INVENTION

The present invention is directed to a method providing for the generation of transistor scattering parameters using a single circuit simulation with a self-correction scheme for the artificial DC voltage dropped across the 50-Ohm resistor representing transmission line impedance. A sub-circuit without 50-Ohm transmission line resistance is used to compute the correct transistor bias currents. This current is used, via a current-controlled voltage source, to compensate for the DC voltage dropped across a 50-Ohm resistor contained in the network that generates device scattering parameters. The single circuit simulation produces both the AC solution and DC solution for simultaneous optimization.

In one aspect of the invention, a single circuit simulation is provided having the capability to retrieve DC measures of the circuit simultaneously with high-frequency RF measures of the circuit.

In another aspect of the invention, a single circuit simulation is provided to simultaneously measure the AC and DC characteristics of a transistor.

BRIEF DESCRIPTION OF THE DRAWINGS

Other aspects, features and advantages of the present invention will be readily appreciated as the invention becomes better understood by reference to the following detailed description when considered in connection with the accompanying drawing figures wherein:

FIG. 1 is a circuit diagram that is known in the art and illustrating a transistor under customary simulations including independent voltage sources $V_{GS}$, $V_{DS}$, $V_{BS}$, $V_{GSC}$ and $V_{DSC}$; the latter two are necessary for tracking the amount of current flowing into the transistor gate and drain;

FIG. 2 is a circuit diagram that is known in the art and illustrating a replication of the circuit shown in FIG. 1 that is suitable for extracting the S11 and S21 transistor scattering parameters (figures of merit of the small signal AC performance) for the transistor depicted in FIG. 1;

FIG. 3 is a circuit diagram that is known in the art and illustrating a replication of the circuit shown in FIG. 1 that is suitable for extracting the S12 and S22 transistor scattering parameters for the transistor depicted in FIG. 1;

FIG. 4 is a circuit diagram illustrating a simulation technique for determining the voltage drop across the 1-Ohm resistor shown in FIG. 2 according to one embodiment of the present invention; and FIG. 5 is a circuit diagram illustrating a simulation technique using the voltage drop shown in FIG. 4 to extract DC current during ac simulation for the transistor depicted in FIG. 1 according to one embodiment of the present invention.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

As stated herein before, the standard approach known in the prior art for generating transistor scattering parameters from a single circuit simulation produces erroneous results because of transistor debiasing caused by the unreal DC voltage dropped across the 50-Ohm resistance that is included to model transmission line impedance in the frequency domain. FIG. 1 is a circuit diagram 100 that is known in the art and that illustrates a transistor 102 under standard simulation conditions including independent voltage sources $V_{GS}$, $V_{DS}$ and $V_{BS}$, as well as dependent voltage sources $V_{GSC}$ and $V_{DSC}$, necessary for tracking the amount of current $I_{VGSC\ and\ IVDSC}$ flowing into the transistor gate and drain respectively.

FIG. 2 is a circuit diagram 200 that is known in the art and that shows a modified replication of the circuit 100 shown in FIG. 1 that is suitable, using SPICE modeling for example, to extract the S11 and S21 transistor scattering parameters for the transistor 102 depicted in FIG. 1. Transistor scattering parameters are specific figures of merit of the small signal AC performance that are well known to those skilled in the art of measuring and modeling transistor scattering parameters and so will not be discussed in further detail to preserve clarity and brevity.

FIG. 3 is a circuit diagram 300 that is known in the art and that shows a modified replication of the circuit 100 shown in FIG. 1 that is suitable, using SPICE modeling for example, to extract the S12 and S22 transistor scattering parameters for the transistor depicted 102 depicted in FIG. 1. Although the circuit models 200, 300 are suitable for measuring the transistor 102 AC characteristics, e.g., scattering parameters S11, S21, S12 and S22, these models are not however, suitable for simultaneously extracting the transistor 102 DC characteristics.

Looking again at FIG. 2, circuit 200 can be seen to include a transmission line impedance, typically 50-Ohms, that is split into two different components comprising a 49-Ohm resistor 202 and a 1-Ohm resistor 204. Two 1-Volt AC supply voltages 206, 208 are provided in a manner familiar to those skilled in the art of circuit modeling to extract the transistor 102 scattering parameter S11 associated with the reflective energy that is flowing back out of the gate of transistor 102. A similar technique is implemented in FIG. 3 that shows the two 1-Volt AC supply voltages 206, 208 applied in a manner to extract the transistor 102 scattering parameter S22 associated with the energy that is reflected back by the drain of transistor 102. The scattering parameter S21 then is associated with the amount of energy that passes through the drain of transistor 102. The scattering parameters S11, S21, S12 and S22 shown in FIGS. 2 and 3 are four parameters that can be measured in a laboratory setting using known circuit simulation techniques such as illustrated by circuits 200 and 300. Since these scattering parameters S11, S21, S12 and S22 are AC parameters known to have both real and imaginary parts, they can be obtained using only AC circuit simulation techniques. The AC circuit simulation techniques associated with circuits 200, 300 shown in FIGS. 2 and 3 however, produce erroneous results because of transistor debiasing due to the unreal DC voltage dropped across the 50-Ohm resistance that is included to model transmission line impedance in the frequency domain.

FIG. 4 is a circuit diagram illustrating a circuit simulation technique 400 for determining the voltage drop across the 1-Ohm resistor 204 shown in FIG. 2; while FIG. 5 is a circuit diagram 500 illustrating a simulation technique using the voltage drop determined via the circuit simulation 400 shown in FIG. 4, to extract DC current during ac simulation of the transistor 102 depicted in FIG. 1, according to one embodiment of the present invention. Specifically, circuits 400 and 500 illustrated in FIGS. 4 and 5 respectively are sub-circuits without the 50-Ohm transmission line resistance and that are used to compute correct transistor 102 bias currents. The correct bias current is used, via a current-controlled voltage source, to compensate for the DC voltage dropped across a 50-Ohm resistor contained in the network that generates device scattering parameters. In this manner, both the AC solution and the DC solution can be produced for simultaneous optimization to provide a correction for the problem of debiasing, which is typically, but erroneously ignored when simulating transistor scattering parameters.

Looking again at FIG. 2, the 50-Ohm transmission line impedance is split into a 49-Ohm impedance 202 and a 1-Ohm impedance 204, as stated herein before. In this way, the voltage across the 1-Ohm impedance 204 can be directly equated to the current passing through the 1-Ohm impedance 204. The desired voltage $V_{ID}$ across the 1-Ohm impedance 204 can be determined using the circuit 400 shown in FIG. 4 that implements a pair of dependent current sources 402, 404 to generate a voltage $V_3$ that is equivalent to $(1/V_{ID})$ across a resistor 406 having a very large value ($10^{12}$ Ohms). The AC current through the resistor 204, using the desired voltage $V_{ID}$, will then be the DC current through the transistor 102.

Moving now to FIG. 5, a resistor 502 is implemented having a value equal to $(1/V_{ID})$ using known simulation techniques, such that when driven by either a 1-Volt DC or 1-Volt AC voltage source, will have a current that is defined as $V_{ID}$. It can be seen that $V_{ID}$, which is the voltage across the 1-Ohm resistor 204, or current through it, is then the drain current of the transistor 102. In summary explanation of the foregoing, the DC voltage drop across the 1-Ohm resistor 204 is transformed into a resistor $R=(1/V_{ID})$ 502 shown in FIG. 5 such that the AC current through resistor 502 is equal to the DC current through resistor 502 to allow extraction of transistor 102 DC characteristics solely using AC simulation techniques.

In view of the above, it can be seen the present invention presents a significant advancement in the art of AC simulation techniques. Further, this invention has been described in considerable detail in order to provide those skilled in the transistor modeling and simulation arts with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow. The transistor modeling and simulation methods described herein may, for example, just as easily be applied to other types of transistors such as a bipolar type transistor having a base, emitter and collector.

What is claimed is:

1. A method of generating transistor scattering parameters comprising the steps of:
   simulating a circuit for the generation of transistor scattering parameters, wherein the circuit comprises a transistor driving a 50-Ohm transmission line impedance having one portion defined by a 1-Ohm impedance; and
   transforming the 1-Ohm impedance into a resistor such that the current through the resistor when driven by either a one-volt DC supply or a one-volt AC supply voltage is equal to the current passing through the transistor.

2. The method according to claim 1 wherein the step of simulating a circuit comprises using solely AC simulation for the generation of transistor scattering parameters.

3. The method according to claim 1 further comprising the step of activating the circuit and selectively measuring the voltage across the resistor or the current through the resistor to extract a scattering parameter associated with the transistor.

4. The method according to claim 3 wherein the scattering parameter is selected from the group consisting of the S21 parameter, the S11 parameter, the S12 parameter and the S22 parameter.

5. A method of generating transistor scattering parameters comprising the steps of:
   simulating a circuit for the generation of transistor scattering parameters solely using AC simulation, wherein the circuit comprises a transistor driving a 50-Ohm transmission line impedance having one portion defined by a 1-Ohm impedance;
   transforming the 1-Ohm impedance into a resistor such that the current through the resistor when driven by either a one-volt DC supply or a one-volt AC supply voltage is equal to the current passing through the transistor; and
   activating the circuit and selectively measuring the voltage across the resistor or the current through the resistor to extract a scattering parameter associated with the transistor.

6. The method according to claim 5 wherein the scattering parameter is selected from the group consisting of the S21 parameter, the S11 parameter, the S12 parameter and the S22 parameter.

* * * * *